United States Patent [19]

Ichihashi

[11] Patent Number: 4,804,840

[45] Date of Patent: Feb. 14, 1989

[54] APPARATUS FOR DETECTING FOCUSED CONDITION OF CHARGED PARTICLE BEAM

[75] Inventor: Noriaki Ichihashi, Tokyo, Japan

[73] Assignee: JEOL Ltd., Tokyo, Japan

[21] Appl. No.: 117,025

[22] Filed: Nov. 4, 1987

[30] Foreign Application Priority Data

Nov. 7, 1986 [JP] Japan .............. 61-264927

[51] Int. Cl.$^4$ ............................................. G01N 23/00
[52] U.S. Cl. ...................................... 250/310; 250/397
[58] Field of Search .................. 250/310, 311, 397

[56] References Cited

U.S. PATENT DOCUMENTS

| | | | |
|---|---|---|---|
| 3,937,959 | 2/1976 | Namae | 250/311 |
| 4,199,681 | 4/1980 | Namae | 250/310 |
| 4,214,163 | 7/1980 | Namae et al. | 250/310 |
| 4,288,692 | 9/1981 | Schamber et al. | 250/310 |

*Primary Examiner*—Bruce C. Anderson
*Attorney, Agent, or Firm*—Webb, Burden, Ziesenheim & Webb

[57] ABSTRACT

It is important for the automatic focusing apparatus incorporated in a scanning-type electron microscope to precisely monitor the focused condition of the electron beam. In an apparatus according to the present invention, the signal emanating from a specimen in response to the irradiation of the electron beam is detected, and the resulting signal is differentiated. The differentiated signal is converted into pulses by a voltage-to-frequency converter circuit. The total count of the pulses is used to monitor the focused condition of the electron beam. This permits the focused condition of the beam to be precisely monitored if the detected signal varies greatly in magnitude.

4 Claims, 5 Drawing Sheets

APPARATUS FOR DETECTING FOCUSED CONDITION OF CHARGED PARTICLE BEAM

FIELD OF THE INVENTION

The present invention relates to an apparatus capable of accurately monitoring the focused condition of an electron beam or ion beam produced in a scanning electron microscope, an ion beam apparatus, or the like.

BACKGROUND OF THE INVENTION

In a scanning-type electron microscope, the surface of a specimen is scanned with an electron beam to display an image of the scanned specimen. An ion beam lithography system produces an ion beam for minutely machining the surface of a material. It is necessary for these instruments to focus the charged particle beam, such as an electron beam or ion beam, for minimizing the diameter of the spot of the beam irradiated on the specimen or machined material. This focusing operation is performed by adjusting the magnitude of electromagnetic or electrostatic lenses which act to focus the charged particle beam. Some apparatus of this kind incorporate devices to automate the focusing process. One example of such apparatus is disclosed in U.S. Pat. No. 3,937,959. All the conventional automatic focusing apparatuses operate on the same principle. In particular, such an automatic focusing apparatus detects a signal generated when the surface of a specimen or a material is scanned with a charged particle beam. The resulting signal is variously processed to obtain information regarding the diameter of the cross section, usually in the form of a circle, of the charged particle beam. Accordingly, if this information is incorrect, it is impossible to perform an automatic focusing operation with sufficient accuracy and reliability.

FIG. 1 is a block diagram of main portions of a scanning electron microscope equipped with a conventional automatic focusing mechanism. This microscope includes an electron gun 1 for producing an electron beam 2. That is, the gun 1 is a kind of charged particle beam source. The beam 2 is focused on a specimen 4 by electromagnetic lens (or lenses) 3. At this time, the condition in which the beam is focused is adjusted by varying the output of a lens power supply 5 that controls the magnitude of the lens 3. Under correctly focused conditions, the spot of the beam 2 on the specimen is minimized. Also, the beam 2 is deflected by a deflector 6 consisting of plural sets of coils and other components disposed in the electron beam path. When a deflector power supply 7 supplies a scanning signal to the deflector 6, the electron beam 2 scans the surface of the specimen. When this scan is being made, a secondary electron signal or other signal is generated at every scanned position. The generated signal is converted into an electrical signal by a detector 8 consisting of photomultipliers or the like and then amplified by an amplifier 9. The output signal from the amplifier 9 is used as a video signal for obtaining a scanning image. Note that the configuration used for this purpose is omitted in FIG. 1. Instead, a circuit for performing an automatic focusing operation is shown.

The automatic focusing operation is carried out by a means mainly consisting of a central processing unit 10 that is composed of a computer. When a human operator specifies automatic focusing mode, the central processing unit 10 supplies a control signal to the deflector power supply 7 to establish deflection mode for automatic focusing. In this deflection mode, as shown in FIG. 2, only a certain line segment located in the x-direction on the surface of the specimen 4 which takes a lattice-like form is repeatedly scanned with the beam 2. Each time such a scan is made in the x-direction, the central processing unit 10 varies the magnitude of the lens 3 via a digital-to-analog converter circuit 11 and the lens power supply 5. The output signal from the amplifier 9 is processed as described above. The resulting signal is used to monitor the focused condition of the beam 2 on the specimen. The magnitude of the monitored signal determines whether the magnitude of the lens is increased or reduced.

FIG. 3 shows the waveforms of video signals delivered from the amplifier 9. The intensity of each signal is plotted against time which corresponds to every scanned position on the specimen. Waveform $a_1$ is obtained when the magnitude of the lens is so adjusted that the beam is correctly focused. Waveform $b_1$ is obtained when such a correct adjustment is not made. Under the focused condition, the diameter of the cross section of the electron beam 2 is sufficiently small and, therefore, the magnitude of the signal, or the waveform $a_1$, changes abruptly when it passes across the lattice of the specimen. On the other hand, under a defocused condition, the diameter of the cross section of the beam 2 is large and so the intensity of the signal, or the waveform $b_1$, changes moderately when it crosses the lattice. The waveforms $a_1$ and $b_1$ are passed through a differentiating circuit 12, resulting in waveforms $a_2$ and $b_2$, respectively, shown in FIG. 4. When the beam 2 is focused well, the obtained waveform $a_2$ has high peaks. When the beam is not focused well, the obtained waveform $b_2$ has low peaks. The peaks of the output signal from the differentiating circuit 12 are detected. The resulting signal can be used to indicate the focused condition of the beam 2. However, since video signals are affected by various noises, if the focused condition of the beam 2 is monitored using only the height of the peaks of the differentiated signal, correct result will not be obtained, and the reliability of the automatic focusing operation will be impaired.

In order to remove these drawbacks, a peak value accumulator 13 is provided. The accumulator accumulates the heights of the peaks of the differentiated signal to produce a signal indicating the focused condition of the beam 2. The deflector power supply 7 produces a blanking signal whenever a scan is made in the x-direction, as well as the scanning signal. The blanking signal is fed to the peak value accumulator 13 as a reset signal and to the central processing unit 10 as a timing signal. The accumulator 13 inverses the peaks of negative polarity of the differentiated signal shown in FIG. 5 to produce waveforms $a_3$ and $b_3$. The heights of the peaks of these waveforms are accumulated as waveforms $a_4$ and $b_4$ shown in FIG. 6. The output signals $h_a$ and $h_b$ from the peak value accumulator 13 are supplied via an analog-to-digital converter circuit 14 to the central processing unit 10, where the signal is employed to indicate the focused condition of the electron beam 2 on the specimen. This signal derived in this way has the advantage that it is not susceptible to noises. Data indicating various focused conditions of the electron beam which are obtained by supplying various control signals to the lens power supply 5 is stored in the central processing unit 10. The value of the optimum control signal to be applied to the power supply 5 is determined according to the stored data. The optimum condition is maintained to complete the automatic focusing operation.

If the current value of the electron beam impinging on the specimen 4 is kept constant, the amount of signal produced from the specimen may vary greatly because of the composition of the specimen and the shape of the surface. For this reason, as shown in FIG. 4, the waveforms of the signal differ greatly in number of peaks and heights of peaks. Accordingly, under the condition that the electron beam is kept in the optimum focused condition, the value $h_a$ of the signal (shown in FIG. 6) produced from the apparatus shown in Fig. I may vary greatly according to the kind of specimen. As a result, the output signal from the peak value accumulator 13 may become too weak or saturated. At this time, it is impossible to correctly monitor the focused condition of the beam. Consequently, the automatic focusing fails to perform correctly.

SUMMARY OF THE INVENTION

It is a main object of the present invention to provide an apparatus capable of accurately monitoring the focused condition of a charged particle beam on a specimen or the like under observation on which the beam impinges.

It is another object of the invention to provide an apparatus capable of accurately monitoring the focused condition of a charged particle beam if the signal obtained by irradiating a specimen with the beam varies greatly in the amount of change in its intensity.

These and other objects of the invention are achieved by an apparatus comprising: a focusing means for focusing and directing a charged particle beam produced from a charged particle beam source onto a specimen; a scanning means for scanning the surface of the specimen with the charged particle beam; and a detector for detecting the signal emanating from the specimen in response to the irradiation of the charged particle beam. This apparatus is characterized in that it further includes a differentiating circuit for differentiating the output signal from the detector, a voltage-to-frequency converter means for producing pulses at a frequency corresponding to the intensity of the output signal from the differentiating circuit, and a counter circuit for counting the number of pulses produced from the voltage-to-frequency converter means.

DESCRIPTION OF THE PREFERRED EMBODIMENTS

Figure 1:
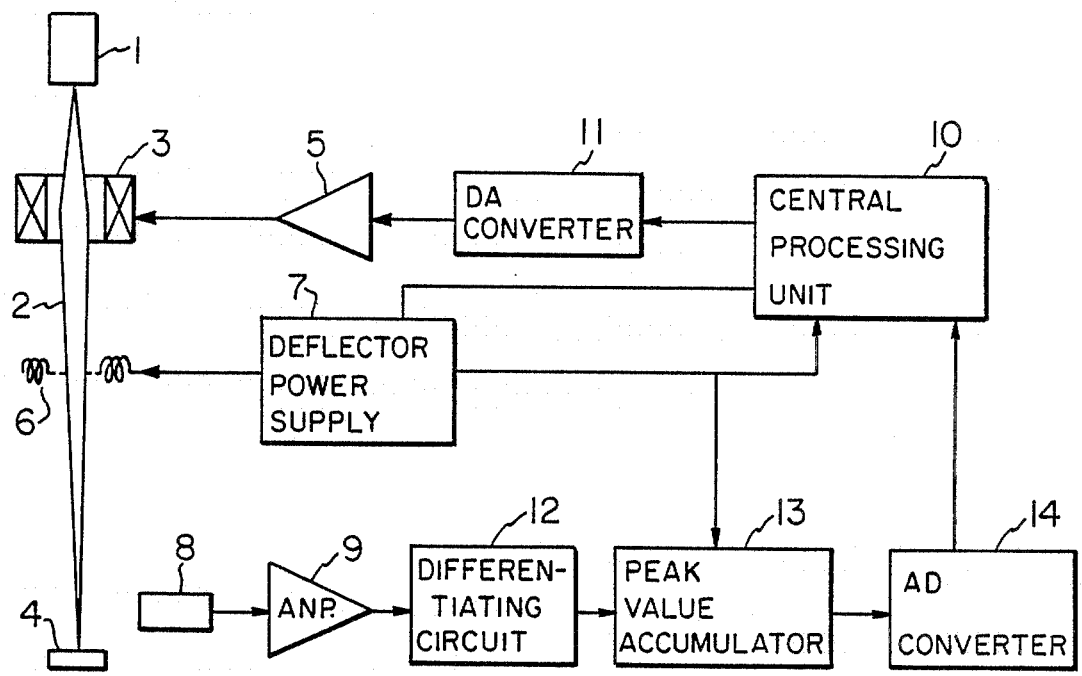
FIG. 1 is a block diagram of main portions of a scanning-type electron microscope equipped with a conventional automatic focusing apparatus.
Figure 2:
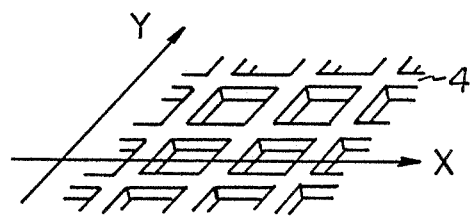
FIGS. 2–6 are schematic diagrams for illustrating the operation of the apparatus shown in FIG. 1.
Figure 7:
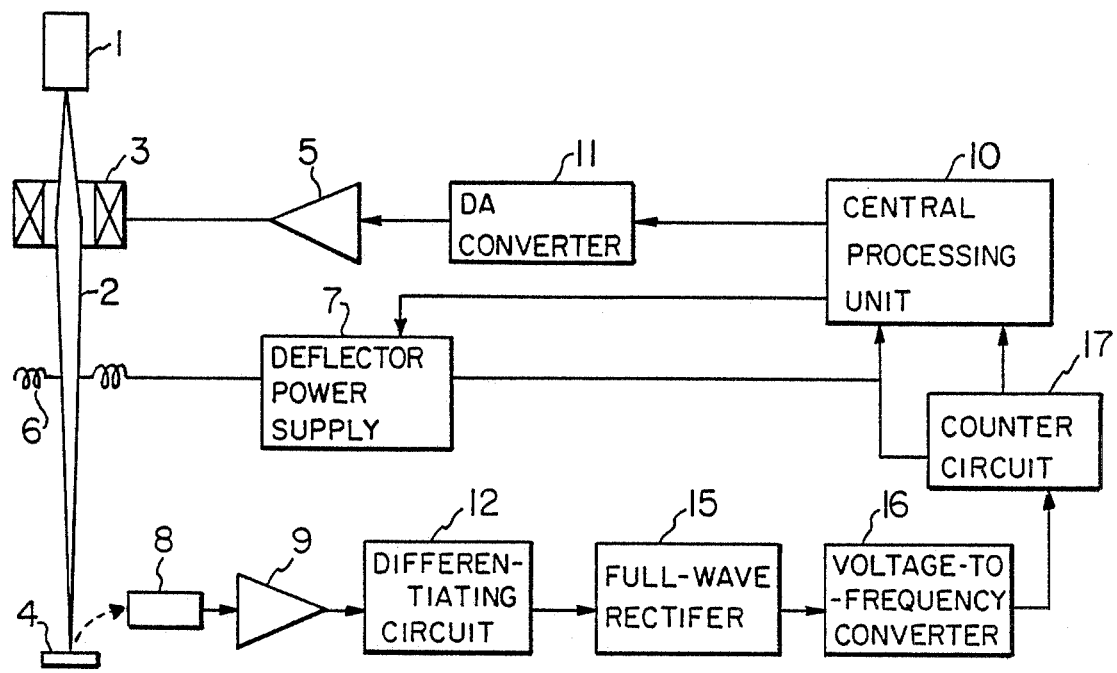
FIG. 7 is a block diagram of an apparatus according to the invention.

Referring to FIG. 7, an apparatus embodying the concept of the present invention is schematically shown. It is to be noted that like components are indicated by like reference numerals throughout all the figures. The apparatus shown in FIG. 7 is similar to the conventional apparatus shown in FIG. 1 except that the peak value accumulator 13 and the AD converter circuit 14 are replaced by a full-wave rectifier circuit 15, a voltage-to-frequency converter circuit 16, and a counter circuit 17. The deflector power supply 7 produces a scanning signal. Further, the power supply 7 delivers a blanking signal whenever a scan is made in the x-direction. The blanking signal is fed to the central processing unit 10 as a timing signal and to the counter circuit 17 as a reset signal.

Figure 4:
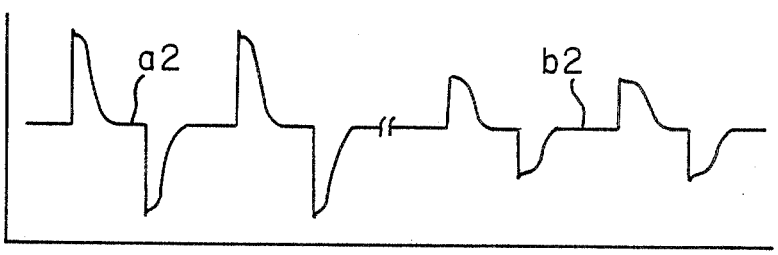
Figure 5:
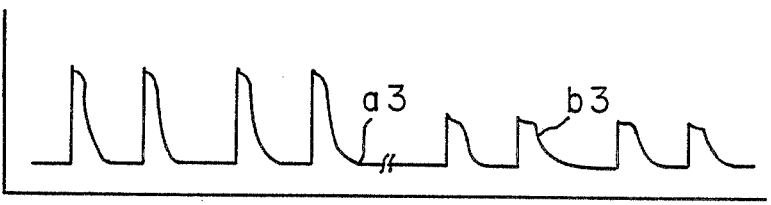
Figure 6:
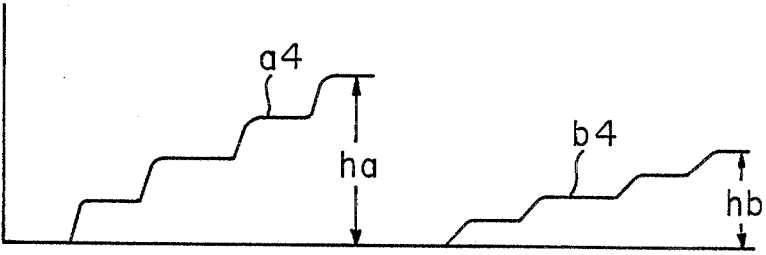
Figure 8:
FIG. 8 is a schematic diagram for illustrating the operation of the apparatus shown in FIG. 7.

In the apparatus shown in FIG. 7, the differentiated signal (FIG. 4) delivered from the differentiating circuit 12 is applied to the full-wave rectifier circuit 15, which generates waveforms $a_3$ and $b_3$ shown in FIG. 5. The output signal from the rectifier circuit 15 is fed to the voltage-to-frequency converter circuit 16 which produces pulses at a frequency corresponding or proportional to its input voltage. The converter circuit 16 generates pulse waveforms $a_5$ and $b_5$ (shown in FIG. 8) corresponding to the waveforms $a_3$ and $b_3$ (shown in FIG. 5). The output pulses $a_5$ and $b_5$ are counted by the counter circuit 17. The total count is directly fed to the central processing unit 10 as a signal indicative of the focused condition of the electron beam. It is possible to replace the full-wave rectifier circuit 15 with a half-wave rectifier circuit.

In the apparatus shown in FIG. 7, the heights of the peaks of the differentiated signal are not directly accumulated in analog form, but the intensity of the differentiated signal is converted into a corresponding number of pulses. The pulses are counted, and the total count is used to indicate the focused condition of the beam. Therefore, the condition can be faithfully monitored if the signal emanating from the specimen varies greatly in intensity or amount. Hence, the automatic focusing operation can be carried out with enhanced reliability.

Figure 9:
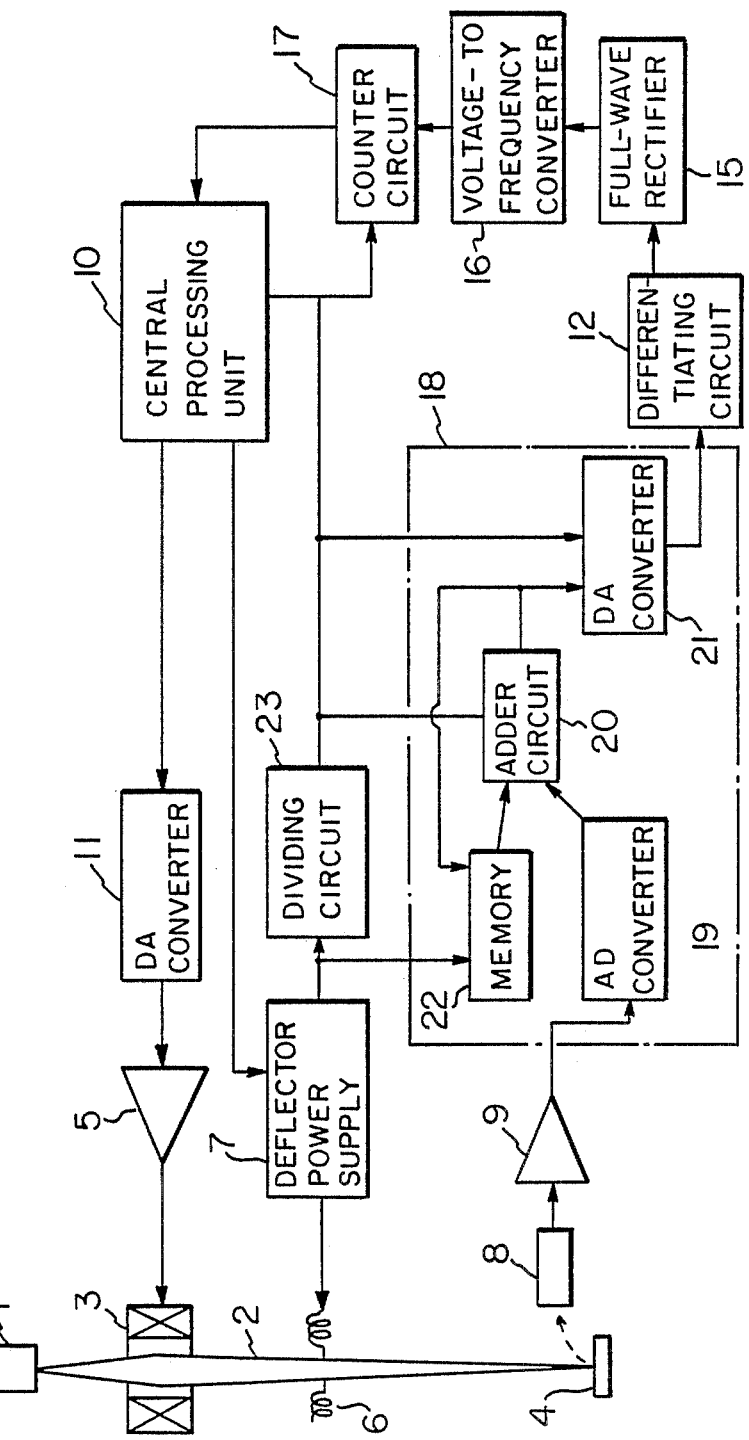
FIG. 9 is a block diagram of another apparatus according to the invention.

Referring next to FIG. 9, there is shown another apparatus according to the invention. The apparatus shown in FIG. 9 is similar to FIG. 7 except that an accumulator 18 is inserted between the amplifier 9 and the differentiating circuit 12. This accumulator 18 does not detect a signal to monitor the focused condition of the beam whenever a scan is made but obtains a signal to monitor the condition whenever a certain number, say n, of scans are made. The accumulator 18 comprises an analog-to-digital converter circuit 19 which converts its input video signal into digital form, an adder circuit 20 to which the output signal from the converter circuit 19 is applied, a memory 22 for storing the output from the adder circuit 20, and a digital-to-analog converter circuit 21 that converts the output from the adder circuit 20 into analog form. The output from the converter circuit 21 is applied as the output from the accumulator 18 to the differentiating circuit 12. A dividing (or multiplying) circuit 23 produces one signal as the deflector power supply 7 produces every n blanking signals. The output signal from the dividing circuit 23 is fed to the central processing unit 10 as a timing signal and to the counter circuit 17 and the adder circuit 20 as a reset signal.

The memory 22 has areas corresponding to thousands of picture elements on line segments of a scanning line extending in the x-direction. When a blanking signal is applied as a timing signal to the memory 22 from the deflector power supply 7, the memory stores the output from the adder circuit 20 in its areas successively. At the same time, video signals which were produced by the previous scan and are stored in the memory are sequentially applied to one input terminal of the adder circuit 20. In this way, the adder circuit 20 always produces the sum of video signals produced by making one to n scans. The digital-to-analog converter circuit 21 which receives the output signal from the adder circuit 20 also receives the output signal from the dividing circuit 23 as a timing signal. The converter circuit 21 delivers the sum of n video signals to the differentiating circuit 12 as the output signal from the accumulator 18, when the timing signal from the dividing circuit 23 is received. The accumulation of the n video signals improves the signal-to-noise ratio by a factor of $\sqrt{n}$.

Figure 3:
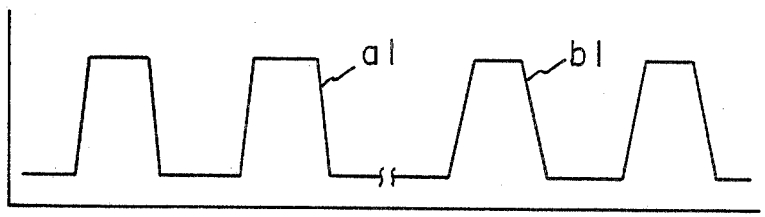

The differential waveforms shown in FIGS. 4 and 5 are not theoretically derived by differentiating the video signal shown in FIG. 3 but actually produced from a differentiating circuit. For such a differential waveform, as the height of the peak is increased, the peak width increases. Therefore, the area of a high peak portion differs greatly from the area of a low peak portion. As a result, the number of produced pulses differs greatly between high and low peaks. For this reason, the number of pulses produced by the voltage-to-frequency converter circuit 16 shown in FIG. 7 differs between high and low peaks of the differential curve. This permits the focused condition of the electron beam to be monitored.

Figure 10:
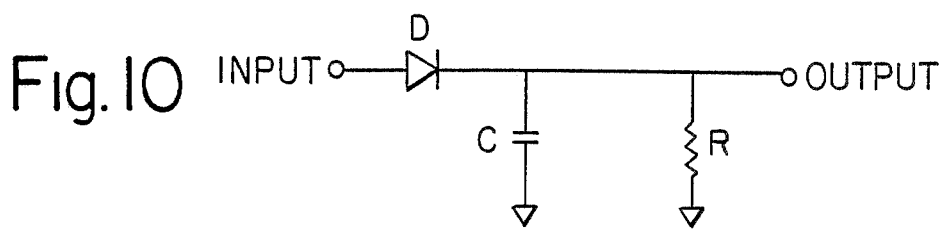
FIG. 10 is a circuit diagram of the main portion of a still other apparatus according to the invention.
Figure 11:
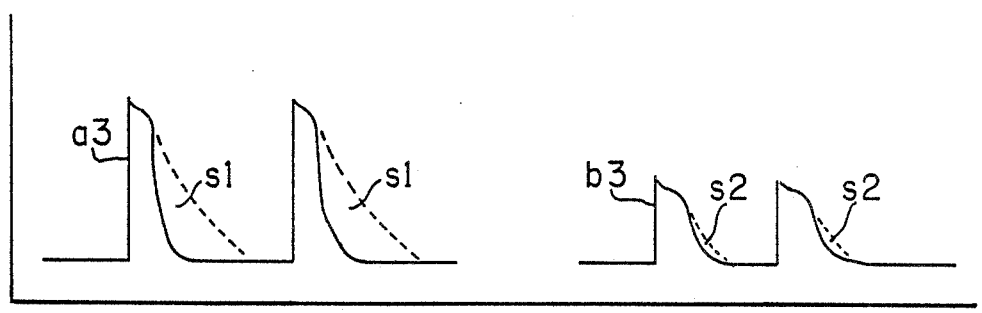
FIG. 11 is a waveform diagram for illustrating the operation of an apparatus incorporating the circuit shown in FIG. 10.

In order to increase the difference in the number of pulses produced from the voltage-to-frequency converter circuit 16 shown in FIG. 7 between high and low peaks of the differential curve, some apparatus equipped with various additional devices are proposed. One example of such an apparatus consists of an apparatus in which a circuit as shown in FIG. 10 is inserted between the differentiating circuit 12 and the voltage-to-frequency converter circuit 16 shown in FIG. 7 so that the falling portions of a pulsed waveform may have a constant moderate inclination. The circuit shown in FIG. 10 changes the pulsed waveforms $a_3$ and $b_3$ of the differentiated signal shown in FIG. 5 into waveforms as indicated by the broken line in FIG. 11. In FIG. 11, $S_1$ and $S_2$ are the increases in the areas of the two kinds of pulsed waveforms, respectively. The increases $S_1$ and $S_2$ have the relation $S_1 > S_2$. As a result, the difference in the number of pulses produced by the voltage-to-frequency converter circuit 16 can be increased between high and low peaks of the differential curve.

Another example of the apparatus for increasing the aforementioned difference as great as possible makes use of an amplifier having a nonlinear amplification characteristic, the amplifier being placed between the differentiating circuit 12 and the voltage-to-frequency converter circuit 16.

Figure 12:
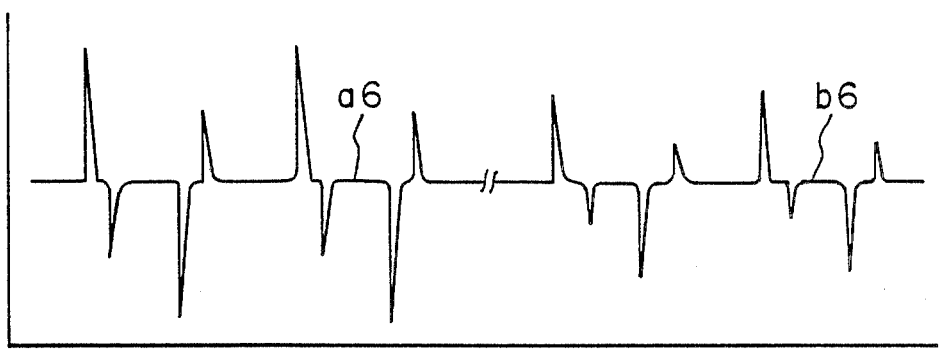
FIG. 12 is a waveform diagram for illustrating the operation of a yet other apparatus according to the invention.

Waveforms $a_6$ and $b_6$ shown in FIG. 12 are obtained by differentiating the first derivative waveforms $a_3$ and $b_3$ (FIG. 5), using a differentiating circuit. That is, the waveforms $a_6$ and $b_6$ are the second derivatives of their original waveforms, and are hardly affected by the peak widths, expressed in terms of time, of the first derivatives shown in FIG. 5. Therefore, the focused condition of the electron beam is monitored to advantage. Thus, the differentiating circuit 12 of the apparatus shown in FIG. 7 or 9 can be replaced by a circuit that differentiates its input signal twice.

As described in detail thus far, each peak height of a signal that is obtained by differentiating a video signal is converted into a corresponding number of pulses. This permits correct detection of a signal representing the focused condition of a charged particle beam even if the signal emanating from the specimen varies greatly. Hence, the reliability of the automatic focusing apparatus of the charged particle beam system is enhanced greatly. Also, the apparatus of the present invention finds applications other than automatic focusing. For example, it can be quite advantageously applied to an automatic astigmatism correction system for correcting for the effects of the astigmatism of a charged particle beam scanning system. The astigmatism correction system is adjusted, using a monitor signal.

What is claimed is:

1. An apparatus for detecting the focused condition of a charged particle beam produced from a charged particle beam source and directed to a specimen, said apparatus comprising:
    a focusing means for focusing the charged particle beam onto the specimen;
    a scanning means for scanning the surface of the specimen with the charged particle beam;
    a detector for detecting the signal emanating from the specimen in response to the irradiation of the charged particle beam;
    a differentiating circuit for differentiating the output signal from the detector;
    a voltage-to-frequency converter means for producing pulses at a frequency corresponding to the intensity of the output signal from the differentiating circuit; and
    a counter circuit for counting the number of pulses produced from the voltage-to-frequency converter means.

2. An apparatus for detecting the focused condition of a charged particle beam produced from a charged particle beam source and directed to a specimen, said apparatus comprising:
    a focusing means for focusing the charged particle beam onto the specimen;
    a scanning means for scanning the surface of the specimen with the charged particle beam;
    a detector for detecting the signal emanating from the specimen in response to the irradiation of the charged particle beam;
    a differentiating circuit for differentiating the output signal from the detector;
    a circuit which receives the output signal from the differentiating circuit and modifies the falling portions of the waveform of the output signal so as to have a constant moderate inclination;
    a voltage-to-frequency converter means for producing pulses at a frequency corresponding to the intensity of the output signal from the last-mentioned circuit; and
    a counter circuit for counting the number of pulses produced from the voltage-to-frequency converter means.

3. An apparatus for detecting the focused condition of a charged particle beam produced from a charged particle beam source and directed to a specimen, said apparatus comprising:

a focusing means for focusing the charged particle beam onto the specimen;

a scanning means for scanning the surface of the specimen with the charged particle beam;

a detector for detecting the signal emanating from the specimen in response to the irradiation of the charged particle beam;

a double differentiating circuit for differentiating the output from the detector twice;

a voltage-to-frequency converter means for producing pulses at a frequency corresponding to the intensity of the output signal from the double differentiating circuit; and a counter circuit for counting the number of pulses produced from the voltage-to-frequency converter means.

4. An apparatus for detecting the focused condition of a charged particle beam produced from a charged particle beam source and directed to a specimen, said apparatus comprising:

a focusing means for focusing the charged particle beam onto the specimen;

a scanning means for scanning the surface of the specimen with the charged particle beam;

a detector for detecting the video output signal emanating from the specimen in response to the irradiation of the charged particle beam;

an accumulator circuit comprising means for summing and storing the video output from the detector during n scans of the beam over the specimen and outputting an accumulated video signal;

a differentiating circuit for differentiating the output signal from the accumulator detector;

a voltage-to-frequency converter means for producing pulses at a frequency corresponding to the intensity of the output signal from the differentiating circuit; and a counter circuit for counting the number of pulses produced from the voltage-to-frequency converter means.

* * * * *